United States Patent [19]

Le Roux

[11] Patent Number: 5,126,672
[45] Date of Patent: Jun. 30, 1992

[54] METHOD FOR THE MEASUREMENT OF THE EFFECTS OF EDDY CURRENTS

[75] Inventor: Patrick Le Roux, Gif/Yvette, France

[73] Assignee: General Electric CGR S.A., Issy les Moulineaux, France

[21] Appl. No.: 576,452

[22] PCT Filed: Mar. 20, 1989

[86] PCT No.: PCT/FR89/00122
§ 371 Date: Sep. 17, 1990
§ 102(e) Date: Sep. 17, 1990

[87] PCT Pub No.: WO89/08852
PCT Pub Date: Sep. 21, 1989

[30] Foreign Application Priority Data

Mar. 18, 1988 [FR] France .................. 88 03582

[51] Int. Cl.$^5$ ............................................. G01R 33/20
[52] U.S. Cl. .................................... 324/309; 324/307
[58] Field of Search .................. 324/300, 307, 309, 318, 324/322; 128/653 R, 653 A, 653 SC

[56] References Cited

U.S. PATENT DOCUMENTS

| | | | |
|---|---|---|---|
| 4,623,843 | 11/1986 | Macovski | 324/309 |
| 4,698,591 | 10/1987 | Glover et al. | 324/307 |
| 4,978,919 | 12/1990 | Hinks | 324/313 |

FOREIGN PATENT DOCUMENTS

| | | |
|---|---|---|
| 0177990 | 4/1986 | European Pat. Off. . |
| 0184840 | 6/1986 | European Pat. Off. . |
| 0228056 | 7/1987 | European Pat. Off. . |
| 0238139 | 9/1987 | European Pat. Off. . |
| 2190276 | 1/1974 | France . |
| 2157832 | 10/1985 | United Kingdom . |

Primary Examiner—Michael J. Tokar
Attorney, Agent, or Firm—Oblon, Spivak, McClelland, Maier & Neudstadt

[57] ABSTRACT

A measurement is made of the effects of eddy currents during a long period (TM) in an NMR machine by placing, in this machine, a probe possessing a material capable of magnetic resonance with a small spin-spin relaxation time, and by proceeding to make a reiteration (PR) of the electromagnetic excitation (17-19) of a resonance signal in this material and to measure the resultant de-excitation NMR signal (20-22), for as many times more as the period during which the effects of the eddy currents have to be taken into account is long. It is shown that this way of doing things enables an accurate appreciation of the corrections to be made to the real field gradient pulses (23-24).

13 Claims, 2 Drawing Sheets

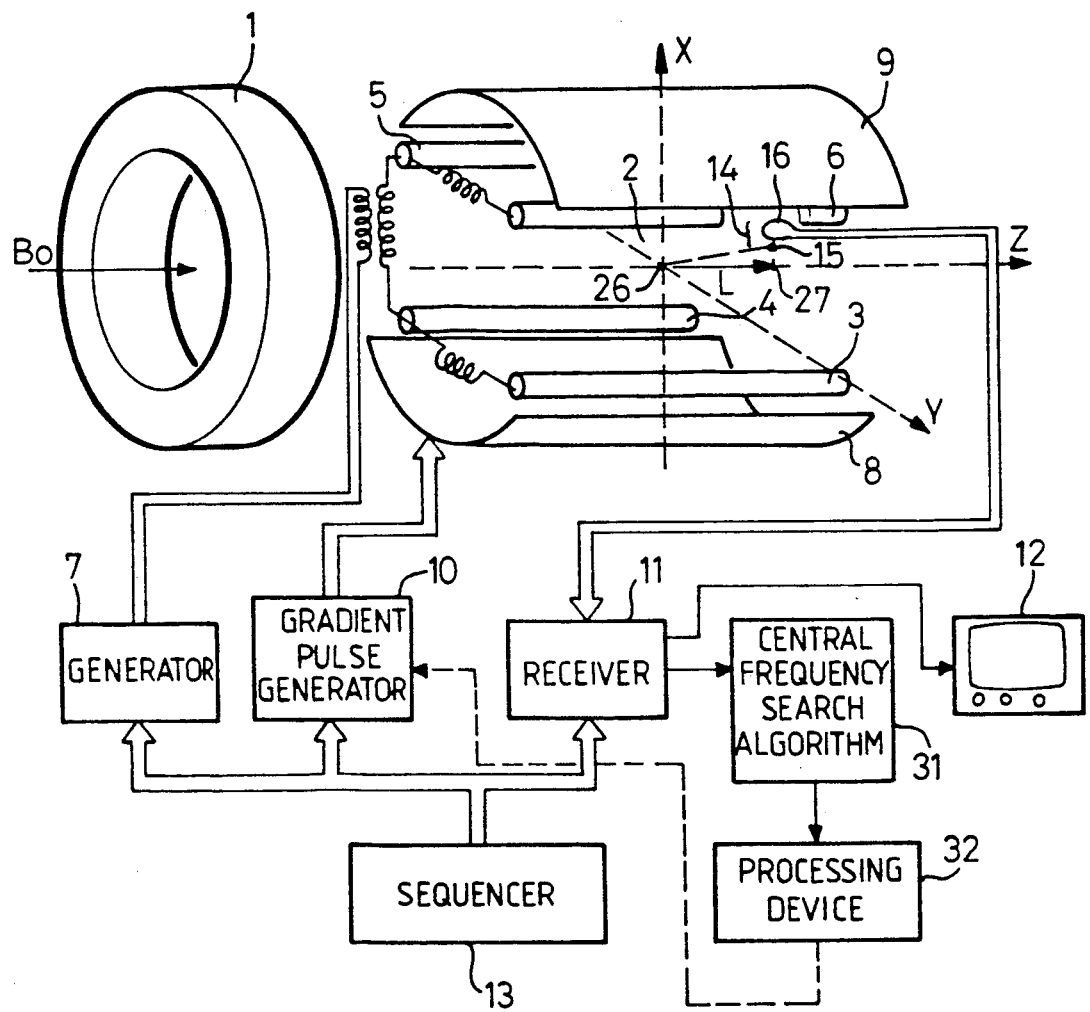
FIG_1

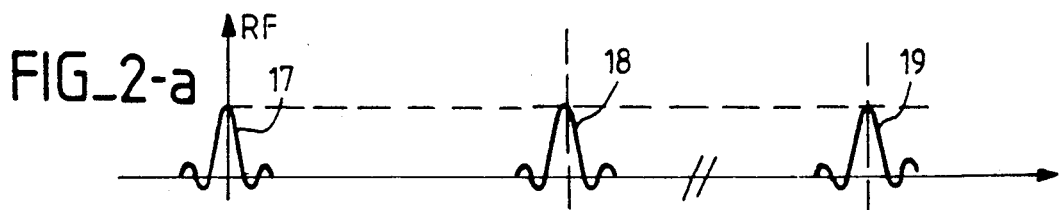
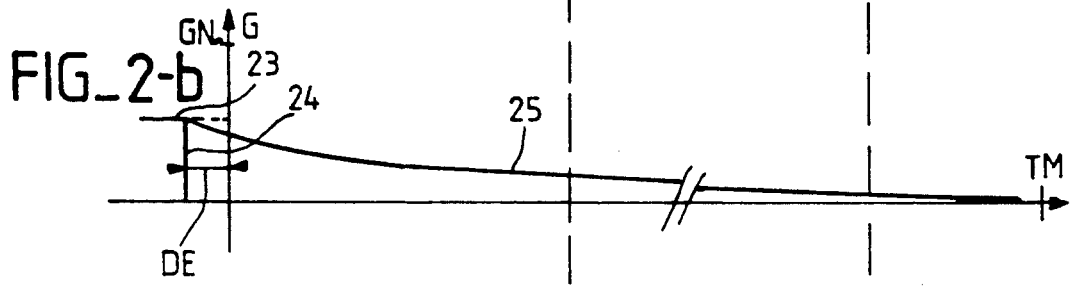
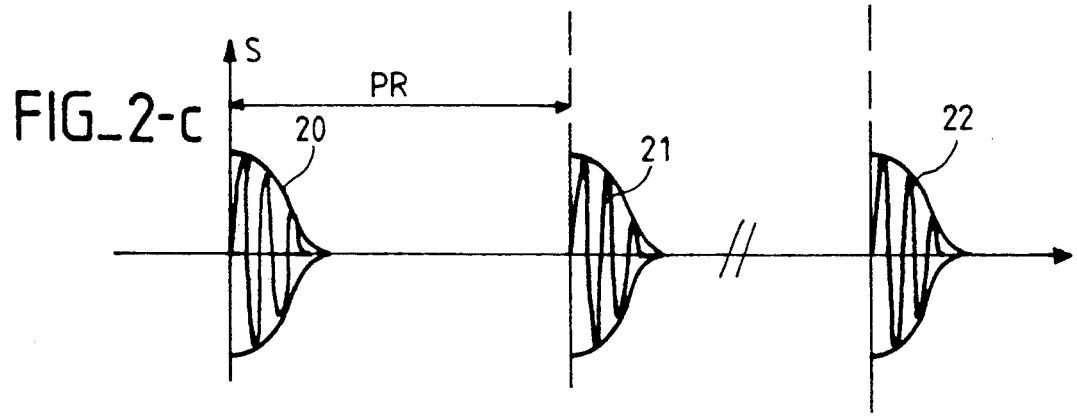
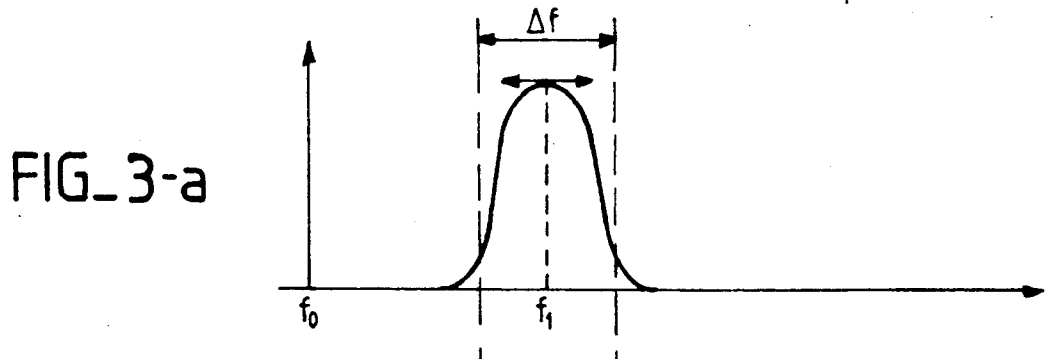
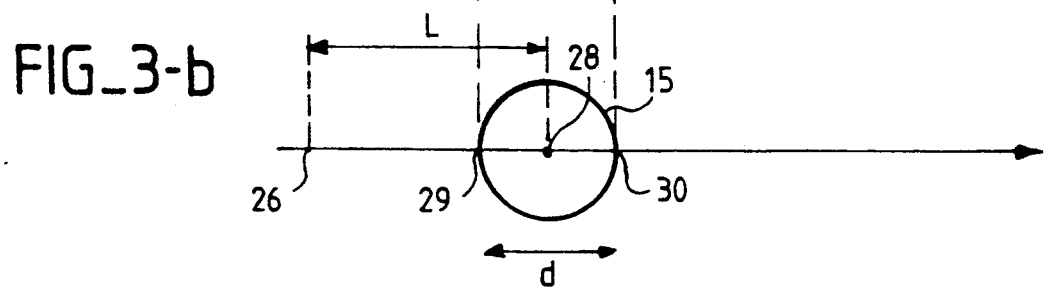

METHOD FOR THE MEASUREMENT OF THE EFFECTS OF EDDY CURRENTS

An object of the present invention is a method for the measurement, in a given period of time, of the effects of eddy currents. This method is chiefly designed to be implemented in medicine, in nuclear magnetic resonance (NMR) experimentation. It is useful, there, for measuring the effects resulting from the application of magnetic field gradient pulses, by means of magnetic field gradient coils, in an NMR imaging machine.

Imaging by nuclear magnetic resonance is known. In imaging experiments according to methods such as this, a body, the internal parts of which are sought to be imaged, is placed in a region where an intense homogeneous magnetic field $B_0$ is created by a magnet. Under the effect of this intense field, the magnetic moments of the body's particles get oriented in the direction of the homogeneous magnetic field. These magnetic moments are then subjected to an electromagnetic radio-frequency excitation tending to make them flip from this orientation. At the end of the excitation, it is possible to measure a de-excitation resonance signal, called an NMR signal, representing the internal parts of this body. This signal corresponds to the return of the orientation of the magnetic moments, in a precessional motion, towards their initial orientation. However, during experimentation such as this, all the particles resonate at the same time. They make their contribution simultaneously to the measured signal.

To enable the portions relating to each of these parts in this signal to be distinguished, in order to reconstruct the image therefrom, there is a known way to magnetically encode the space in which the body to be imaged is placed during the excitation, between the excitation and the measurement of the de-excitation, or even during the measurement of this de-excitation signal. These encodings are applied by coils producing a particular encoding magnetic field. These particular magnetic fields have an essential component, measured in parallel to the orientation of the homogeneous magnetic field, the value of which changes in space as a function of the coordinates of a point of this space where this component acts.

There is a known standard way to identify the examination space with an orthonormal reference XYZ. Generally, the direction Z is the direction attributed to the homogeneous magnetic field. The gradient coils then produce magnetic fields, the essential component of which, measured along Z, is a function of X for a coil said to have a gradient X, a function of Y for a coil said to have a gradient Y and a function of Z for a coil said to have a gradient Z. Then, knowing a sequence during which an excitation and magnetic space encodings have been applied, there is a known way to extract, from the measured de-excitation signal, information relating to the distribution of the different particles in the body. In fact, this distribution can be determined only after a reiteration of these acquisition sequences. During this reiteration, the encodings, the field gradients, are modified from one sequence to another.

One of the particular aspects of the field gradients created, therefore, is that they are pulsed. They are set up, they persist for a pre-determined period, then they are cut off. Now, their being set up or their being cut off are essentially the cause of the eddy current. In effect, an NMR machine includes the magnet to produce the homogoneous field, an antenna to apply the electromagnetic radio-frequency excitation, and the gradient coils proper. When the magnet is of the superconductor type, it further includes a screen capable of damping the magnetic energy created if, by accident, the phenomenon of superconductivity, which enables the field to be sustained, should happen to fail (by a fault in the magnet cooling system, for example). All these devices are mechanically supported by metallic structures, if not metallic themselves, and are therefore liable to let eddy currents develop when the field gradient pulses are set up and cut off. And eddy currents such as this are themselves the cause of stray magnetic fields proportionate to their intensities. In addition, the eddy currents have a response that is deferred in time with respect to the action that gives rise to them.

It has been attempted to reduce the effects of the eddy currents by reducing the self-inductance set up by the metallic parts. It has also been recommended that the magnetic vector potential created should be neutralized, at these metallic parts, by adding on, for each gradient coil, another gradient coil, called a compensating coil, having a neutralizing effect at the location of these metallic parts but having no adverse effect in the vital zone of examination inside the magnet. However, these approaches are not wholly satisfactory.

In effect, one of the particular features of the de-excitation NMR signal measured is its quick fading. This quality of fading is related essentially to the homogeneity defect of the main magnetic field of the machine. In effect, independently of the encoding pulses applied, the magnetic moments return to their initial orientation in precessing at a frequency which is a function of the intensity of the main magnetic field. In view of the homogeneity defects of the different regions of the examination zone of the magnet, magnetic moments originally in phase may quickly be found to be in phase opposition with respect to one another. Owing to their precessional frequency difference, these phases get shifted with respect to one another. As a result, the NMR signals, produced by particles located in the different regions of the body, tend to neutralize one another at the end of a certain period. Under these conditions, their measurement no longer gives any results.

To prevent this effect, a so-called spin echo method (or, as the case may be, a so-called gradient echo method) has been used to cause a reflection of the phase dispersal due to the non-homogeneities of the main magnetic field. The consequence of this reflection of the dispersal is that the NMR signal gets revived, after the reflection, at the end of a duration equal to that between the arising of the NMR signal and this reflection itself. The signal picked up at the end of a first reflection such as this is called a first echo signal. It is possible, with the first echo signals measured in all the sequences, to produce a so-called first echo image.

However, the phenomenon of the reflection of the phase dispersal evolves, after the revival, as a phase dispersal proper. It is then possible, during each acquisition/measurement sequence, to reiterate the action of reflection so as to give rise to a second echo NMR signal and, continuing in this way, a third echo signal and even a fourth echo signal, or further. The evolution of the signal between the first echo and the fourth echo may be highly revealing of the evolution of the spin-spin relaxation time, also called $T_2$, of the particles under examination. Although the fourth echo signal is more difficult to measure because it is far weaker than the first echo signal, its physical significance is important because it enables the relaxation time sought, $T_2$, to be measured with precision. Now, the compensation for the effects of eddy currents, envisaged in the prior art, are of little effectiveness in removing the influence of the eddy currents on the fourth echo NMR signals which get revived long after the excitation.

Another, better known method, used in NMR machines from the very beginning, to remove the effects of the eddy currents when the gradient pulses are applied, has consisted in making electric currents, the intensity of which already takes the disturbing effect of these eddy currents into account, flow through the gradient coils producing these magnetic gradient fields. As a result, the magnetic gradient field created is then perfect in principle. Associated with the first techniques for compensating for the effects of the eddy currents, this method gives good results inasmuch as it is possible to have sufficiently precise knowledge of the intensities of the electrical currents that can be made to flow through these coils for this compensation to take place.

In view of what has been explained earlier and, notably, because of the fact that the fourth echo signal has to be measured, it is important to have neutralized the effects of the eddy currents until the time of this measurement of this fourth echo signal. Now, in an excitation-measurement sequence, the fourth echo NMR signal is measured well after the excitation itself. With echo times of the order of 60 milliseconds, the fourth echo NMR signal is measured at the end of a duration that is substantially equal to 240 milliseconds after the arising of the NMR signal. It is therefore important to have knowledge, throughout this period, of the effects of the eddy currents. This measurement is complicated in the sense that, at the end of a period such as this, the effects of eddy currents such as this are small: their measurement is of little precision. On the other hand, their effects are very disturbing.

The principle of the measurement of the effects of the eddy currents by the use of an NMR probe has been described by P. HEUBES to the Congress of the Society of Magnetic Resonance in Medecine, summary of papers, p. 315, 1984. Another presentation thereof was made by E. Yamamoto and H. Kohno, published in J. PHYS.: SCI. INSTRUM. No. 19, 1986 and, finally, by Frantz Schmitt to the Congress of the same Society of Magnetic Resonance in Medicine, 1987, summary of papers, page 445. The principle of these measurements consists in the placing of an NMR probe in a suitable place in the machines, in the electromagnetic excitation of the material, capable of electromagnetic resonance, contained in this probe, in its subjection to a characteristic field gradient pulse, in the measurement of the evolution of the resonance signal in the course of time and in the comparison of this evolution with an expected theoretical evolution corresponding to a perfect gradient field at the place where the probe is located.

Since the probe cannot physically have zero dimensions, it soon turned out that a phenomenon of phase opposition occurs, at the end of the certain time, between contributions to the NMR signal given by parts of the probe located at one of its ends and at another, with respect to the orientation of the field gradient. Ultimately, the field gradient to be assessed acts in the probe like a non-homogeneity of the main magnetic field. It gives the resonance signal of the probe a fading character. This fading occurs even if, as should be the case, the resonant material of the probe has a long relaxation time $T_2$ (longer than the duration of the sequence with four echos). To avoid this fading, which prevents the measurement of the NMR signal of the probe at the end of a sufficiently long period (250 milliseconds or 500 milliseconds) the idea, in the second document cited, was to provoke a spin echo of the NMR signal measured in the probe. In view of the application of the field gradient pulse to be measured, between the excitation pulse and the spin echo pulse, it is necessary to provoke the revival of the NMR signal in the probe to be replaced, symmetrically with respect to the spin echo pulse, a gradient pulse with the same direction and the same value as the gradient pulse for which it is sought to assess the effects of the eddy currents.

In the third document cited, rather than provoking a spin echo phenomenon, a gradient echo phenomenon is provoked by using a gradient pulse to be assessed, the direction of which alternates regularly, for a certain number of times, during the measurement. However, this does not counter the effect of the non-homogeneity of the field $B_0$ which still tends to phase shift the magnetizations.

All these techniques have the drawback wherein the shape of the gradient pulses for which it is sought to assess the effects of the eddy currents is then imposed. Essentially, this shape is related to the notion of the echo, whose particular features of provoking the revival of the NMR signal are thus turned to advantage. In effect, in an NMR sequence, most of the gradient pulses have neither a symmetrical nor an alternating character. The result thereof, as a consequence, is that the measurement of the effects of the eddy currents, by such methods, can only be a theoretical measurement. And the use of its results can produce only a mathematical modelling of its effects. Subsequently, a deduction is made therefrom, in a practical way, of the intensities of the currents that have to be made to flow in the field gradient coils so as to eliminate the effects of the eddy currents. However, this theoretical modelling is inconvenient. It leads to a complicated and unwieldy theory.

Thus, for example it is not possible to create a regulation loop taking a measurement into account to act simply on an intensity value with a view to overcoming these defects. The signal of the probe cannot be used directly as an error signal.

It is an object of the method to overcome these drawbacks in choosing a diametrically opposite method of measurement. In the prior art referred to, for the signal to continue being measurable, it was necessary to choose a material capable of magnetic resonance in the probe, with a long spin-spin relaxation time. If possible, this time was far longer than the period at the end of which it is desired to know the effects of the eddy currents. Consequently, at the end of this period, the NMR signal in the probe could still be measured in order to measure its effects. By opposition, in the invention, a different procedure is adopted. On the contrary, a choice is made of a material which is capable of magnetic resonance but has a very small spin-spin relaxation time. In one example, we take the approximate fading time (5 milliseconds) of the NMR signal, this fading being due to the non-homogeneity created by the gradient to be measured. The duration of this fading time is due to the size of the probe (of the order of 2 millimeters) and to the degradation of the precession frequency over a distance such as this for a magnetic field gradient with a given value (0.25 Gauss per centimeter). Preferably, this given value is an intermediate value with respect to the nominal value of a real gradient to be applied. In choosing a material with a short time $T_2$, it is ensured that the successive measurements are independent of one another.

To know the signal throughout the fall in the effect of the eddy currents, a repetition of the electromagnetic excitation of the probe and consecutive measurements of the de-excitation NMR signal that it re-emits are then done. Re-excitation is done as many times as, and at all instants in the sequence when, it is necessary. In other words, in a particular sequence according to the invention, the gradient pulse is applied, outside the presence of an excitation pulse in the probe. This gradient pulse is cut (we are then in the presence of the trail of this pulse, which is what concerns us), the probe is excited regularly during this trail, and a de-excitation signal is measured each time. It is shown that, by acting in this way, it is possible to have sufficiently precise knowledge of the long fall time constants in the effects of the eddy currents, without having to impose any gradient shape specific to the measurement of these eddy currents but by choosing, on the contrary, gradient pulse shapes that are quite comparable to those that are subsequently implemented in the imaging sequences proper.

An object of the invention, therefore, is a method for measurement, during a period of time, of the effects of the eddy currents, these effects resulting from the application of a magnetic field gradient pulse, by means of a magnetic field gradient coil, in a machine to perform NMR experiments comprising the following steps:

a probe containing a material capable of resonance is placed in the machine;

the probe is subjected to a gradient pulse;

the probe is excited by means of a radio-frequency electromagnetic excitation;

the NMR signal of the probe, resulting from this excitation and this gradient pulse, is measured at instants at which it is desired to know the effects of these eddy currents;

characterized in that:

the excitation is reiterated several times during the period;

and a material is chosen with a spin-spin relaxation time smaller than the duration between the reiterations.

The invention will be better understood from the reading of the following description and the examination of the accompanying figures. These figures are given purely by way of indication and in no way restrict the invention. The figures show:

FIG. 1: a machine for the implementation of the method of the invention;

FIGS. 2a, 2b, and 2c: are timing diagrams of an excitation-measurement sequence which can be used to implement the method of the invention;

FIGS. 3a and 3b show the frequency diagram of the free precession signal arising in the probe owing to the size of this probe, its position and the size of the field gradient.

FIG. 1 gives a schematic view of an NMR machine for the implementation of the method according to the invention. This machine has, symbolically represented by a coil 1, a magnet to produce an intense and homogeneous magnetic field in an examination zone 2 where a body to be imaged is supposed to be placed. The machine further includes an antenna, for example of the type with radiating bars 3 to 6 to induce in the zone 2, at the time of the examination, radio-frequency electromagnetic excitation pulses produced by a generator 7.

So as to encode the space and enable the distinguishing of the contributions, in the NMR signal, of the parts of the body to the parts of the images, the machine further has gradient coils symbolized by the devices 8 and 9 and powered by a gradient pulse generator 10. A reception signal 11 enables the receiving of the de-excitation NMR signal emitted by the particles of the body at the end of the excitation. A display device 12 makes it possible to show images of the sections of the body being examined in the machine after processing of the NMR signals received. All these means work under the control of a sequencer 13 which organizes the application of the excitation pulses, the field gradient pulses and the measurement of the NMR signal.

In a known way, for the measurement of the effects of the eddy currents in the structure (not shown) of the machine, a probe 14 is used. This probe 14 consists essentially of a small quantity 15 of a material capable of magnetic resonance and an associated antenna 16. The probe is placed in the examination zone 2 of the machine. The antenna 16 is used to pick up the NMR signal emitted by the material 15 under the effect of an excitation applied by the antenna 3 to 6. However, the excitation can also be applied by the antenna 16, in controlling the working of this antenna by means of the sequencer and in interposing a duplexer in its link to the generator 7 and to the receiver 11. In normal operation, receiver 11 may, furthermore, be connected by a duplexer (not shown), to the antenna with radiating bars 3 to 6. It may also be connected to a surface antenna laid on the patient's body at the place to be imaged.

FIGS. 2a to 2c respectively show the radio-frequency excitation signals RF, the gradient signals G, and the received NMR signals S. The experiment applied in the invention essentially comprises radio-frequency excitations, such as 17 to 19 that give rise, each time, to free precession signals, 20 to 22 respectively. The gradient pulse for which it is sought to assess the effects of the eddy currents is, for example, the pulse 23. The constant value of this pulse at its peak is substantially half of the value of a nominal magnitude GN of a field gradient that can be used with this machine. In this way, the gradient pulse is studied in the range of linear variation of this pulse.

Naturally, the effects of the eddy currents are assessed gradient coil by gradient coil. In one example, the gradient coil examined is a gradient coil producing a gradient along Z (FIG. 1). FIG. 2b shows the drop-off time 24 of the gradient pulse 23, and the trail 25 of the magnetic field which remains and corresponds to the effects of the eddy currents produced by the gradient pulse 23, after this pulse is cut off. The duration of this trail is long, its fall time constants are big. In view of the need to know the effects of the eddy currents for echos of the NMR signal of a high order in the sequences, the value of this trail must be measured over a long duration TM of the same order as the longest excitation sequences that the machine makes it possible to implement.

In a practical example, with a field gradient of the order of 0.25 Gauss per centimeter, and with a probe 14, the material 15 of which is contained in a sphere of the order of two millimeters, the NMR signal of the probe has a brief existence, of the order of 5 milliseconds. This is particularly visible when examining the response curves 20 to 22 in FIG. 2c. It is understood, consequently, that the phase dispersal due to the presence of the gradient pulse 23, or its trail 25 which it is sought to measure, is such that, at the end of the duration TM, no NMR signal will any longer be measurable. It is for this reason that, in the prior art, firstly an echo phenomenon is used to cause the revival of the NMR signals of the probe at the end of a period which is double the period between the excitation of the probe and the instant when the echo is provoked, and, secondly, a long spin-spin relaxation time $T_2$ is chosen. In this way, at the end of the duration TM, this NMR signal, reviving under the effect of an echo, was still measurable. In practice, the prior art probes contained pure water.

On the contrary, in the invention, a material with a small spin-spin relaxation time $T_2$ is chosen. This entails a penalty since there is then only little time available to measure the NMR signal. By contrast, the material of the probe can be re-excited fairly frequently without giving rising to phenomena, in this material, similar to an SSFP (steady state free precession) signal between the different excitations. These SSFP type phenomena, which are such that there would then be a rejection of the NMR signal due to an excitation in the NMR signal due to a following excitation, would then falsify the measurement results. In practice, water with added copper sulphate has been chosen as a material capable of magnetic resonance. However, other materials can equally well be envisaged.

In practice, during a measuring period TM of the order of 500 milliseconds, it is then possible to make twenty reiterations of the excitation 18 and of the measurement 21 of the NMR signal. We thus obtain a repetition period PR of the order of 25 milliseconds. In choosing a material, the $T_2$ of which is at least five times smaller, for example of the order of five milliseconds, we generally find materials, among them $T_1$, the spin-lattice relaxation time of which is of the order of 30 milliseconds. Since the duration T1 is then of the same order as the duration PR, it is necessary, when applying the pulses 17 to 19, not to cause a total flip-over of the longitudinal magnetization of the magnetic moments of the particles. On the contrary, this magnetization is made to flip-over by a small angle, for example 30 degrees. So much so that it may beconsidered that, at the end of the duration $T_1$, the longitudinal magnetization has been completely restored. This would not be the case if the flip-over had been the maximum, if the orientation had flipped over by 90 degrees. The result of this is that the NMR signals 20 to 22, measured at the end of each of these excitations, are quite comparable to one another. The other great advantage, then, is that of being able to have a measurement of the NMR signals at any dates in the course of the duration TM without having had to make concessions on the shape of the pulse 23.

FIG. 2b further shows that the excitation 17 is applied after the fall 24 of the gradient pulse 23 to be assessed. Furthermore, it also shows a shift DE between the end 24 of the pulse 23 and the date of application of the pulse 17. This duration DE should be added to all the periods PR in order to know the instant, with reference to the fall 24 of the pulse 23, at which the measurement is located. The existence of the duration DE may be further turned to advantage in order to make a measurement, in another experiment with a different duration DE, of the effects of the trail 25 at intermediate dates in the periods PR. For example, the experiment can be started again by doing DE=mPR/n. Continuing thus, it is possible to have temporal knowledge, that is as precise as is desired, of the effects of the eddy currents in choosing m and n, with m varying from 0 to n−1.

In FIG. 1, it is seen, for the measurement of a gradient Z, that the probe 14 is not placed at the center 26 of the machine but, rather, vertically to a position 27 located at a distance L from this center. The following is the value of this choice. If the probe is placed at a distance L from the center 26 with respect to the direction of the gradient considered, the benefit is obtained, at the position where this probe is placed, of a magnetic field encoding which is substantially equal to the product of the field gradient to be assessed by the length of the divergence L. Consequently, the further the probe is placed from the center, (in the zone of linearity of the gradient, of course), the more sensitive will be the measurement.

FIG. 3a shows the spectrum of the NMR signal picked up by the antenna 16. If the gradient were not present, and if there were no eddy current effect, the probe would resonate at a frequency $f_0$ depending on the intensity of the field $B_0$ and on the gyromagnetic ratio $\Gamma$ of the material of the probe. In the absence of the field gradient, its signal would resonate at the frequency $f_0$ itself, irrespectively of the place of this probe in the machine. By contrast, in the presence of a field gradient, or of the trail 25 due to the eddy current of the corresponding gradient pulse, the magnetic material of the probe resonates at a frequency $f_1$ that is shifted from the frequency $f_0$. The shift is proportionate to the amplitude of the gradient, on the one hand, and to the distance between the probe and the center of the machine, on the other. When the effects of the eddy current are decreasingly felt, their "corresponding gradient" gets reduced so that, towards the end of the experiment, the frequency $f_1$ tends to approach the frequency $f_0$. For the same reasons, moreover, towards the end of the experiment, the fading of the NMR signal is less fast.

FIG. 3b shows, in correspondence with FIG. 3a, the probe 15 placed at the distance L from the center 26. As the probe 15 is not reduced to a theoretical point, the NMR signal produced by the magnetic moment of the particles located at the center 28 of the probe 15 is different from the signal produced by the magnetic moments of the particles located at the ends, 29 and 30 respectively, of this probe along the direction of the gradient Z applied. The spectrum of the signal corresponding to these different contributions has a width $\delta f$. This width $\delta f$ is related to the dimension d by the same relationship as the one relating $(f_1 - f_0)$ to L. As the measurement $f_1$ is thus done to within $\delta f$, it can be deduced therefrom that the precision of the measurement is equal to $\delta f/(f_1 - f_0)$ which is itself equivalent to d/L. In the practical example chosen, where d is of the order of 2 millimeters and where L is equal to 10 centimeters, the precision thus obtained is of the order of 2%.

This is notably insufficient and, in practice, it is necessary to obtain a precision of the order of 5/10000th. But it is known that there are devices 31 (FIG. 1) or, more particularly, methods implemented by computers which make it possible to recover the central frequency $f_1$ corresponding to the central frequency, with the greatest amplitude, of a spectrum spreading over $\delta f$. The knowledge of $f_1$ may then have the effect of reducing the measurement error by a factor of 30. Under these conditions, the desired precision of 5/10000 is achieved.

The use of an autonomous probe, i.e. one having its own emission and reception antenna and its own reception circuit may, furthermore, prove to be particularly useful for the implementation of the invention. In effect, the method of the invention makes it possible to give the value $f_1$ at the output of the device 31 for seeking the central frequency of the spectrum of the NMR signal of resonance of the probe. This value directly represents the effect of the eddy currents at the instant of their measurement. In other words, at the end of a duration TM after the application of a gradient pulse, the account of the trail of the effect of these currents is known. It is then possible to use this information, delivered by the device 31, to introduce it into a processing device 32 which prepares a correction magnitude. This correction magnitude can itself be applied to the inputs of the gradient generator 10.

Thus a regulation of the value of the gradient pulses is achieved without having to carry out any theoretical modelling to deduce them. By contrast, in the prior art methods referred to, since the measurements of the eddy currents were measurements corresponding to specific field gradient pulses, the results of these measurements could not be directly transposed to the field gradient pulses, effectively implemented in the sequences, without a theoretical analysis. This theoretical analysis went against the application of a simple feedback acting in real time on the setting of the supplies of the gradient coils. When the probe is used to enable a regulation of the value of the gradient pulses, this probe can be left in the machine, even when an imaging experiment is undertaken on a patient, provided that the antenna is lightly sheathed. In effect, owing to the association of the antenna 16 with the material 15, the gain at the position of the material 15 is such that a light shielding suffices.

With the method of the invention, it is naturally also possible to achieve a theoretical modelling of the effects of the eddy currents. In a particularly worthwhile approach, an application will be made, during the experiment itself, of the field gradient pulses at any instants, and they will also be cut off at any instants. The shape of the gradient pulses applied is preferably the same as the shape of the pulses effectively implemented in the imaging experiments. Known system-identification techniques then make it possible to find the transfer function linking the control of the gradients and the response, measured by $f_1$, of the eddy currents.

What is claimed is:

1. A method for the measurement, during a given period (TM) of time, of the effects (25) of the eddy currents, these effects resulting, during this period, from the application of a single magnetic field gradient pulse (23), by means of a magnetic field gradient coil (8, 9), in a machine (1-13) to perform NMR experiments comprising the following steps:
    a probe (14) containing a material (15) capable of resonance is placed (L) in the machine;
    the probe is subjected to a gradient pulse (23);
    the probe is excited (3-7) by means of a radio-frequency electromagnetic excitation (17-19);
    the NMR signal (20-22) of the probe, resulting from this excitation and this pulse, is measured (11) at instants (PR) at which it is desired to know the effects of these eddy currents;
    characterized in that:
    the excitation is reiterated several times during the period;
    and a material is chosen with a spin-spin relaxation time smaller than the duration between the reiterations.

2. A method according to claim 1, characterized in that the reiterations are regularly distributed during the period.

3. A method according to any one of the claims 1 or 2, characterized in that the spin-spin relaxation time is more than five times smaller than the duration between the reiterations.

4. A method according to any one of the claims 1 or 2, characterized in that that the gradient pulse has an amplitude that is substantially equal to half (GN/2) of the nominal amplitude that it may have.

5. A method according to any one of the claims 1 or 2, characterized in that the probe is placed as far as possible (L) from the center (26) of the machine.

6. A method according to any one of the claims 1 or 2, characterized in that the frequency ($f_1$) of the resultant NMR signal to deduce the effect of the eddy currents therefrom, and in that this frequency measurement is subjected to a central frequency search algorithm (31).

7. A method according to any one of the claims 1 or 2, characterized in that it is restarted, in making a shift (mPR/n) in time of the excitations of the measurements with respect to the application (24) of the field gradient pulse.

8. A method according to any one of the claims 1 or 2, characterized in that a probe (14) is used with a sheathed inherent excitation antenna (16).

9. A method according to claim 8, characterized in that the magnetic material of the probe is excited after (DE) the application of the gradient pulse.

10. A method according to claim 1, characterized in that any gradient commands are applied during the measurements to model the effects of the eddy currents.

11. A method according to claim 1, characterized in that radio-frequency electromagnetic excitations are chosen, the nutation angle of which is set as a function of the repetition period (PR) and of the spin-lattice relaxation time of the material, so as to obtain a maximum signal.

12. A method according to claim 1, characterized in that excitations are chosen, the intensity of which is smaller, by half, than the intensity of a nominal excitation that can be used with the machine.

13. Implementation of the method according to claim 1, at the same time as an NMR experiment, with a view to cancelling the effects of the eddy currents.

* * * * *